(12) United States Patent
Yoon

(10) Patent No.: US 7,094,643 B2
(45) Date of Patent: Aug. 22, 2006

(54) METHOD OF FORMING GATE OF FLASH MEMORY CELL

(75) Inventor: Chul Jin Yoon, Kyunggido (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/022,648

(22) Filed: Dec. 28, 2004

(65) Prior Publication Data

US 2005/0142726 A1    Jun. 30, 2005

(30) Foreign Application Priority Data

Dec. 30, 2003    (KR)    ............... 10-2003-0101011

(51) Int. Cl.
*H01L 21/336*    (2006.01)

(52) U.S. Cl. .................. 438/257; 438/261; 438/264

(58) Field of Classification Search ................ 438/257, 438/261, 264
See application file for complete search history.

(56) References Cited

U.S. PATENT DOCUMENTS 5,915,177 A * 6/1999 Tseng ......................... 438/264
6,413,818 B1 * 7/2002 Huang et al. ................ 438/257

* cited by examiner

*Primary Examiner*—Christian D. Wilson
*Assistant Examiner*—Douglas Menz
(74) *Attorney, Agent, or Firm*—Finnegan, Henderson, Farabow, Garrett, & Dunner, L.L.P.

(57) ABSTRACT

A method of forming a gate of a flash memory cell, by which a coupling effect between floating and control gates can be enhanced by forming a polysilicon spacer in forming the floating gate to increase a surface area of the floating gate. The gate is formed by forming a nitride layer pattern on a substrate to define a prescribed space, forming a polysilicon spacer at a sidewall of the nitride layer pattern within the defined space on the first polysilicon, and removing the nitride layer pattern.

6 Claims, 3 Drawing Sheets

METHOD OF FORMING GATE OF FLASH MEMORY CELL

This application claims the benefit of the Korean Application No. P2003-0101011 filed on Dec. 30, 2003, which is hereby incorporated by reference.

BACKGROUND OF THE INVENTION

1. Field of the Invention

The present invention relates to a method of forming a gate of a flash memory cell, by which a coupling effect between floating and control gates can be enhanced by forming a polysilicon spacer to increase a surface area of the floating gate.

2. Discussion of the Related Art

Generally, a non-volatile semiconductor device enables to store data therein without power supply provided thereto as well as enables electrical data erase and write, and its application range expands in various fields.

The non-volatile semiconductor devices are categorized into the NAND type for high degree of device integration and the NOR type for high speed according to memory cell array structures thereof, respectively. Hence, their advantages are utilized popular for many applications.

The NOR type non-volatile semiconductor device directly associated with the present invention consists of a plurality of memory cells, each of which comprises a single transistor, connected parallel to one bit line. Specifically, one cell transistor is connected between a drain connected to the bit line and a source connected to a common source line to enable current increase and high-speed operation of the memory cell. Yet, areas occupied by a bit line contact and source line are increased to have difficulty in achieving high memory device integration.

In the above-featured NO type non-volatile semiconductor device, a memory cell is configured in a manner of stacking a floating gate, insulating interlayer, and control gate in turn. And, a series of device operations associated with data storage, erase, and read are performed in a following manner. In doing so, a programming associated with the data storage is performed by hot electron injection or F-N (fowler-Nordheim) tunneling and an erasing associated with the data erase is performed by F-N tunneling. In the following example, the programming is performed by hot electron injection.

First of all, the programming is explained. By applying a voltage to the bit line and the control gate to form a channel between the source and drain, hot electrons are generated from the drain. The generated electrons go over a gate insulating layer barrier or a tunneling insulating layer barrier due to the gate voltage to be injected into the floating gate. Hence, the programming is achieved so that data can be written in an erased cell.

Thus, if the floating gate is filled with electrons, a threshold voltage of the memory cell is raised by the electrons. If the cell is read by supplying a power source voltage (3.3V or 5V) to the control gate connected to the wordline, a current fails to flow therein since a channel fails to be formed due to the high threshold voltage. Hence, one kind of state can be memorized.

Meanwhile, in case of performing the erasing to store new information, the control gate is grounded and a strong electric field is applied between both ends of the gate insulating layer between the floating gate and the substrate by applying high voltage to the source. If so, the gate insulating layer barrier becomes thinner so that the electrons stored within the floating gate by F-N tunneling penetrate the thin insulating layer barrier to drain toward the substrate. Hence, the data erase is completed. As a result, there exist no electrons in the floating gate to lower the threshold voltage of the cell. If the cell is read by applying the power source voltage to the control gate, one state different from the previous state can be memorized.

Namely, the data read is performed in a manner of deciding a presence or non-presence of current of the memory cell transistor by applying an appropriate voltage to the bit line and control gate of the selected cell.

FIG. 1A and FIG. 1B are cross-sectional diagrams for explaining a method of forming a gate according to a related art.

FIG. 1A shows a step of depositing a gate insulating layer, a first conductor layer, a first insulating layer, and a second insulating layer.

Referring to FIG. 1A, a gate insulating layer 11 is formed on a substrate 10 having a prescribed device formed therein. A first conductor layer 12 for forming a floating gate is deposited on the gate insulating layer 11. And, a first insulating layer 13 and a second insulating layer 14 are stacked on the first conductor layer 12 for insulation between a control gate and floating gate that will be formed later. In doing so, the gate insulating layer 11 may be formed of either oxide or nitride. Preferably, the gate insulating layer 11 is formed of an upper oxide layer/nitride layer/lower oxide layer to have an ONO (oxide-nitride-oxide) structure.

Moreover, the first conductor layer 12 is formed in a manner of depositing silicon and crystallizing the deposited silicon into polysilicon or mono-crystalline silicon, which will be etched to form the floating gate. Preferably, the first and second insulating layers 13 and 14 are formed of oxide and nitride, respectively.

FIG. 1B shows a step of etching the second insulating layer, the first insulating layer, and the first conductor layer in turn to form a gate.

Referring to FIG. 1B, photoresist is coated on the second insulating layer. And, exposure and development are carried out on the photoresist to form a photoresist pattern (not shown in the drawing).

Subsequently, the second insulating layer, the first insulating layer, and the first conductor layer are etched using the photoresist pattern to form a floating gate pattern including the floating gate 15. In doing so, the oxide layer of the gate insulating layer 11 can be used as an etch stop layer.

However, in the related art gate forming method, a junction area between the control and floating gates is limited to a surface area of the floating gate only, whereby a coupling effect is small.

SUMMARY OF THE INVENTION

Accordingly, the present invention is directed to a method of forming a gate of a flash memory cell that substantially obviates one or more problems due to limitations and disadvantages of the related art.

An object of the present invention is to provide a method of forming a gate of a flash memory cell, by which a coupling effect between floating and control gates can be enhanced by forming a polysilicon spacer in forming the floating gate to increase a surface area of the floating gate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a gate of a flash memory cell according to the present invention includes the steps of forming a nitride layer pattern on a substrate to define a prescribed space for a floating gate, forming a first polysilicon on the substrate within the defined space, forming a polysilicon spacer at a sidewall of the nitride layer pattern within the defined space on the first polysilicon, and removing the nitride layer pattern.

Preferably, the method further includes the steps of stacking an ONO layer and a conductor over the substrate and etching the conductor and the ONO layer to form a control gate.

Preferably, the floating gate comprises the first polysilicon and the polysilicon spacer.

Preferably, the first polysilicon is formed within the defined space not to exceed 30~80% of a height of the nitride layer pattern.

More preferably, the first polysilicon is formed by performing a first anisotropic etch on a first polysilicon layer deposited over the substrate.

Preferably, the polysilicon spacer is formed by performing a second anisotropic etch on a second polysilicon layer deposited over the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
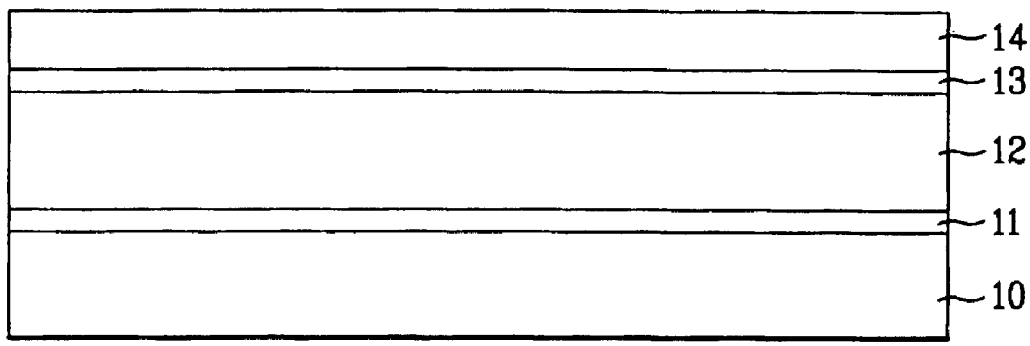
FIG. 1A and FIG. 1B are cross-sectional diagrams for explaining a method of forming a gate according to a related art.
Figure 1B:
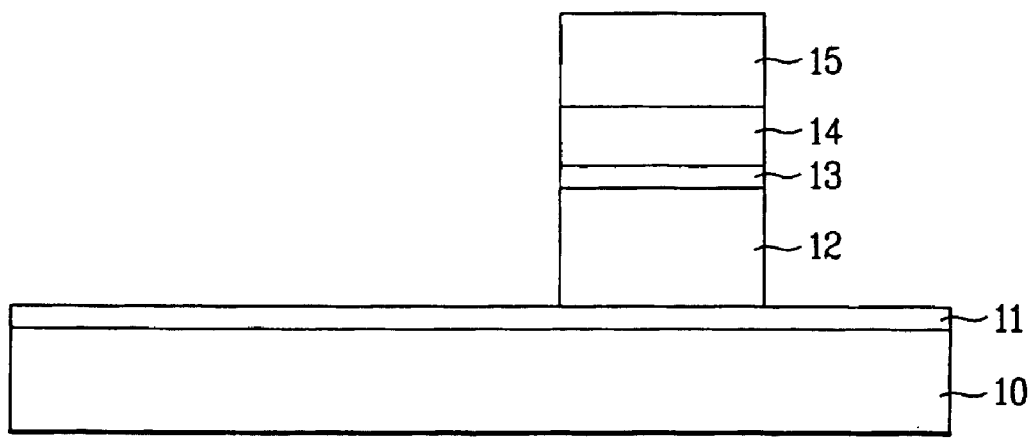
Figure 2A:
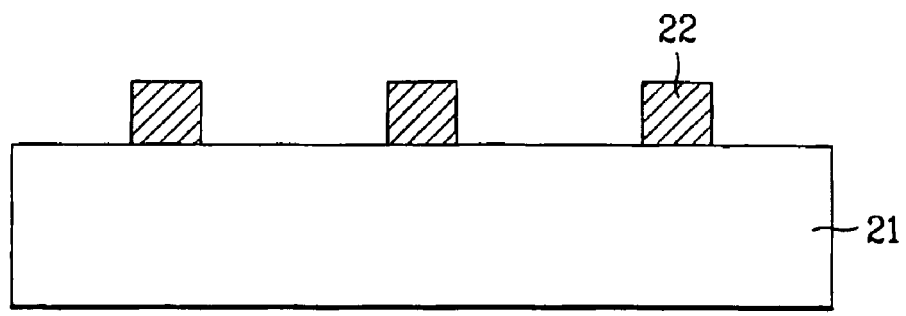
FIG. 2A, FIG. 2B, FIG. 2C, and FIG. 2D are cross-sectional diagrams for explaining a method of forming a gate according to the present invention.
Figure 2B:
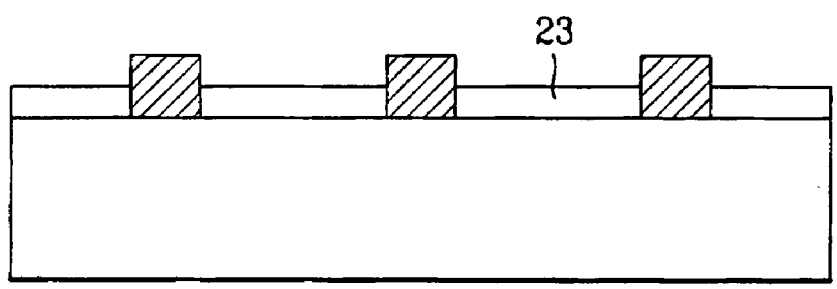

FIG. 2A and FIG. 2B are cross-sectional diagrams for explaining a method of forming a gate according to the present invention.

First of all, FIG. 2A shows a step of forming to pattern a nitride layer on a substrate having a prescribed device formed therein.

Referring to FIG. 2A, a nitride layer is formed on a substrate 21 having a prescribed device formed thereon. The nitride layer is then patterned using a photoresist pattern (not shown in the drawing) to form a nitride layer pattern 22 leaving a space between gates. The nitride layer pattern 22 defines a field area as well as leaves the space between the gates.

FIG. 2B shows a step of forming a first polysilicon and performing a first anisotropic etch.

Referring to FIG. 2B, a first polysilicon 23 is formed on the substrate including the nitride layer pattern.

A first anisotropic etch is carried out on the first polysilicon 23 to leave the first polysilicon as high as 30~80% of the height of the nitride layer pattern. In doing so, it is important to leave an even thickness of the first polysilicon by the first anisotropic etch.

Figure 2C:
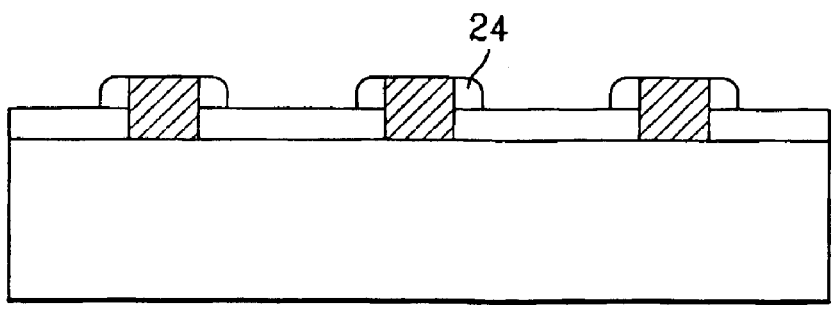

FIG. 2C shows a step of forming a second polysilicon over the substrate and performing a second anisotropic etch to form a polysilicon spacer.

Referring to FIG. 2C, a second polysilicon is formed over the substrate.

A second anisotropic etch is carried out on the second polysilicon to leave a polysilicon spacer 24 on lateral sides of the nitride layer pattern. Namely, the second polysilicon is etched not to remain on a topside of the nitride layer pattern to form the polysilicon spacer 24.

Figure 2D:
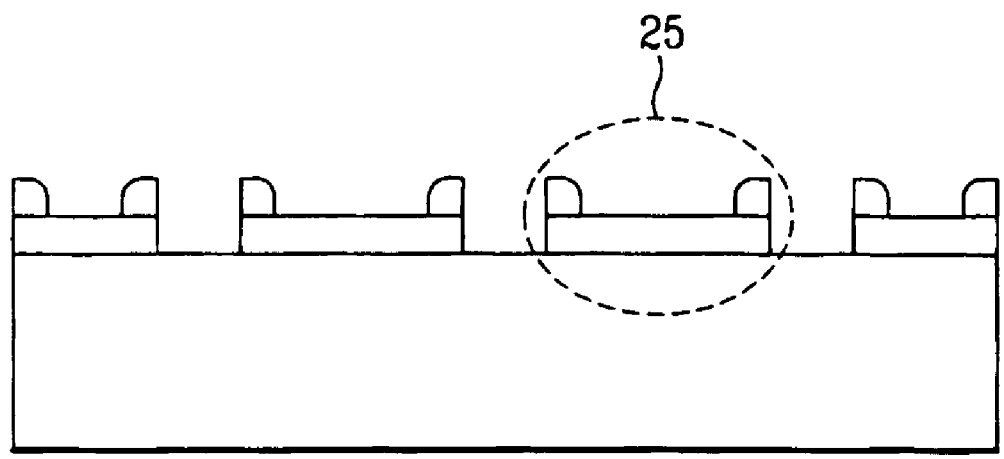

FIG. 2D shows a step of removing the nitride layer pattern.

Referring to FIG. 2D, the nitride layer pattern is removed from the substrate so that the first polysilicon and the polysilicon spacer can remain on the substrate only. Hence, a floating gate 25 constructed with the remaining first polysilicon and the polysilicon spacer is formed.

Subsequently, an ONO (oxide/nitride/oxide) layer (not shown in the drawing) and a conductor (not shown in the drawing) are stacked over the substrate including the floating gate 25, and are then etched to form a control gate (not shown in the drawing). Hence, a flash memory gate is completed.

Accordingly, the flash memory cell gate forming method of the present invention increases the effective area between the floating and control gates by forming the floating gate provided with the polysilicon spacer to remarkably raise a coupling effect, thereby enabling to reduce a voltage applied to the control gate.

Moreover, the related art step of etching the mask nitride layer of the floating gate is not needed, whereby the present invention enables to reduce a cost.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a gate of a flash memory cell, comprising the steps of:
   forming a nitride layer pattern on a substrate to define a prescribed space for a floating gate;
   forming a first polysilicon on the substrate within the defined space;
   forming a second polysilicon over the substrate including the first polysilicon;
   forming a polysilicon spacer at a sidewall of the nitride layer pattern within the defined space on the first polysilicon by etching the second polysilicon until at least a portion of the first polysilicon is exposed; and
   removing the nitride layer pattern.

2. The method of claim 1, further comprising the steps of:
stacking an ONO layer and a conductor over the substrate; and
etching the conductor and the ONO layer to form a control gate.

3. The method of claim 1, wherein the floating gate comprises the first polysilicon and the polysilicon spacer.

4. The method of claim 1, wherein the first polysilicon is formed within the defined space not to exceed 30~80% of a height of the nitride layer pattern.

5. The method of claim 4, wherein the first polysilicon is formed by performing a first anisotropic etch on a first polysilicon layer deposited over the substrate.

6. The method of claim 5, wherein the polysilicon spacer is formed by performing a second anisotropic etch on a second polysilicon layer deposited over the substrate.

* * * * *